United States Patent
Franzen et al.

(10) Patent No.: US 6,533,620 B2
(45) Date of Patent: Mar. 18, 2003

(54) ELECTRICAL CONNECTION METHOD AND CONNECTION SITE

(75) Inventors: Frank Franzen, Bad Abbach (DE); Detlef Haupt, Steinsberg (DE); Josef Loibl, Bad Abbach (DE)

(73) Assignee: Siemens Aktiengesellschaft (DE)

(*) Notice: Subject to any disclaimer, the term of this patent is extended or adjusted under 35 U.S.C. 154(b) by 0 days.

(21) Appl. No.: 09/923,732

(22) Filed: Aug. 7, 2001

(65) Prior Publication Data
US 2002/0001984 A1 Jan. 3, 2002

Related U.S. Application Data

(63) Continuation of application No. PCT/DE00/00308, filed on Feb. 1, 2000.

(30) Foreign Application Priority Data

Feb. 18, 1999 (DE) .......................... 199 06 807

(51) Int. Cl.$^7$ .............................................. B23K 26/00
(52) U.S. Cl. ................... 439/876; 219/121.64
(58) Field of Search .................. 439/876; 219/121.64, 219/121.63

(56) References Cited

U.S. PATENT DOCUMENTS

| | | | | |
|---|---|---|---|---|
| 4,618,739 A | * | 10/1986 | Theobald | |
| 4,647,133 A | * | 3/1987 | Renken et al. | |
| 5,041,015 A | * | 8/1991 | Travis | |
| 5,127,570 A | * | 7/1992 | Steitz | 228/103 |
| 5,144,412 A | * | 9/1992 | Chang et al. | |
| 5,462,626 A | | 10/1995 | Kanayama et al. | 156/272.8 |
| 5,676,865 A | | 10/1997 | Chang | 219/121.64 |
| 6,359,236 B1 | * | 3/2002 | DiStefano et al. | 174/261 |

FOREIGN PATENT DOCUMENTS

| | | |
|---|---|---|
| DE | 19618099 | 11/1997 |
| EP | 0163581 | 12/1985 |
| GB | 1018622 | 2/1963 |
| WO | 9844593 | 10/1998 |

OTHER PUBLICATIONS

Anonymous, "Heterocyclic Organic Metal Complex Surface in Laser Welding for Surface Mount Interconnections", 2244 Research Disclosure, No. 296, 1988.
English–language Abstract for JP 08 107 272.
English–language Abstract for JP 07 094 035.

* cited by examiner

*Primary Examiner*—Neil Abrams
(74) *Attorney, Agent, or Firm*—Baker Botts LLP

(57) ABSTRACT

In a method for producing an electrical connection between a flexible printed-circuit board (1) and a metallic mating contact member (8), an illumination opening (5) is formed in a first insulating layer (2) and a connecting opening (6) is formed in a second insulating layer (3). A section (8a) of the metallic mating contact member (8) is brought into bearing contact with a conductor track (4) through the connecting opening (6). Welding/soldering of the conductor track (4) to the connecting section (8a) is brought about by radiant heating by means of laser light (9) directed through the illumination opening (5).

10 Claims, 2 Drawing Sheets

ELECTRICAL CONNECTION METHOD AND CONNECTION SITE

This is a continuation of copending application Ser. No. PCT/DE00/00308 filed Feb. 1, 2000, PCT Publication WO 00/49841. which claims the priority of DE 199 06 807.0 filed Feb. 18, 1999.

FIELD OF THE INVENTION

The invention relates to a method for producing an electrical connection between a flexible printed-circuit board and a metallic mating contact member; the electrical connection site realized between said elements; and an arrangement which makes use of such an electrical connection site for installation in an engine or a gearbox of a motor vehicle.

BACKGROUND OF THE INVENTION

A large number of connection techniques for connecting electrical components to a flexible printed-circuit board are known in the art. One such method for realizing a welded joint between a flexible printed-circuit board and a metallic conductor is described in U.S. Pat. No. 5,676,865. In this method, opposite openings are made in the bottom and top insulating layers of the flexible printed-circuit board, so that a conductor track running in between is exposed on both sides in the regions of the openings. The exposed conductor track is provided with a central hole. The edge of the hole of the conductor track then undergoes a forming operation in such a way that it comes into contact with the electrical conductor on which the flexible printed-circuit board is resting with its base. Finally, the conductor track is welded onto the conductor by means of a laser in the region of the hole.

One problem with this method is that occasionally, on account of the central hole, there is insufficient conductor track material for a secure and permanent welded joint. Furthermore, bending down of the edge of the hole onto the conductor, as disclosed, presents technical problems.

Another connection method is disclosed in EP 0 163 581 B1, wherein an electrical connection is formed by a bent, flexible, two-layer connecting printed-circuit board between two parallel printed-circuit boards which are separated by a heat sink. The two parallel printed-circuit boards each have a projecting contact piece, which is soldered to an exposed contact point of the printed-circuit board. However, it is not possible to produce a welded join between the flexible two-layer printed-circuit board and the contact piece.

SUMMARY OF THE INVENTION

The present invention provides a method for producing an electrical connection between a flexible printed-circuit board and a metallic mating contact member which can be carried out easily and inexpensively and at the same time results in a mechanically stable and electrically safe connection. Further, the connection sites created by the novel method are also suitable for electrically bonding electrical components under aggravated ambient conditions, as are encountered in a gearbox or engine of a motor vehicle.

Close bearing or contiguous contact between the conductor track and the connecting section of the metallic mating contact member are required for the subsequent laser welding/soldering. This is reliably ensured, since the opening width of the connecting opening is dimensioned such that it is greater than the lateral dimensions of the connecting section of the metallic mating contact member, and hence the latter can be brought up to the exposed conductor track without any problem. The conductor track remains planar, i.e. it does not have to undergo any forming operations. During welding, the conductor track quickly melts in a central region, ensuring that adequate material is available for the building up of a stable welded joint. Because of the good thermal contact between the melted conductor track material and the connecting section of the mating contact member, the latter also melts.

Where a soldered joint is required, a soldering material is additionally provided in a way known per se between the conductor track and the connecting section. The soldering material may be deposited, for example, as an end layer of solder on the connecting section on the conductor track.

In a preferred embodiment of the method according to the present invention, a through-hole penetrating the conductor track, having smaller lateral dimensions than the width of the connecting opening, is formed between the connecting opening and an illumination aperture. A projection provided on the connecting section of the mating contact member is led through the through-hole. During the welding operation, the laser light radiates directly onto the projection, which then melts, flows onto the conductor track and together with the latter results in the welded joint by melting of the conductor track. The projection consequently represents a "supply of welding material" for the creation of the connection. In a soldering operation, the soldering material may be deposited on the projection or on the conductor track.

It has been found that no additional absorption layer is required on the side of the conductor track irradiated by the laser light in order for sufficient energy for the melting of the conductor track to be coupled during the welding process.

In the production of the flexible printed-circuit board, it is preferred to apply an organic anticorrosive layer to the conductor track and thereby covering the conductor track within the light-radiating opening. Undesired surface oxidation of the conductor track in the region of the opening is also avoided by this anticorrosive layer.

The conductor track preferably has a thickness of between 40 and 150 $\mu$m, and preferably between 50 and 70 $\mu$m. It has been found that, in this thickness range, high-quality welded joints can be achieved largely without any problems.

The method according to the invention is used with particular advantage for the direct electrical bonding of contact pins or terminal pins of an electrical component to the flexible printed-circuit board.

An important technical application of the electrical connection site according to the present invention is the bonding of electrical components which are associated with a control device in an engine or gearbox of a motor vehicle. For such "mechatronic" control systems, as they are known, there has recently been developed a technical concept in which an electronic circuit accommodated in the control device housing is in electrical connection with the electrical components via a flexible printed-circuit board led through a sealing gap in the housing to the outside. Details of the construction with regard to the connection between the electronic circuit and the flexible printed-circuit board and the housing bushing are described in WO 98/44593 and are incorporated herein by reference. In this context, the electrical connection site according to the present invention consequently provides a suitable (and inexpensive) way of connecting the electrical components (sensors, actuators, etc.) present in the gearbox (engine) directly, (without component connectors or the like) to the flexible printed-circuit board, such that the connection is able to withstand the ambient conditions encountered in a gearbox (engine) (temperature range of approximately −40° C. to 150° C., and vibrations up to approximately 40 g).

DRAWINGS

The present invention is further disclosed below in the context of a preferred embodiment and also with reference to the drawings, in which.

Figure 4:
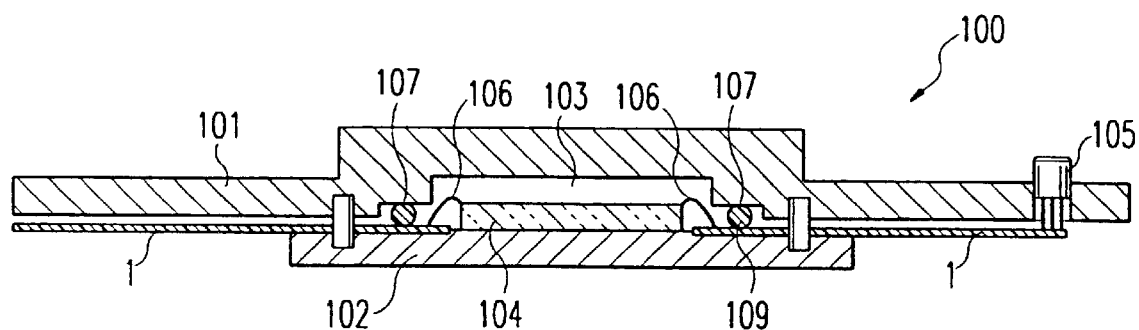
Figure 5A:
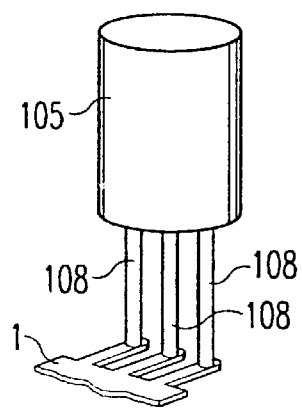
Figure 5B:
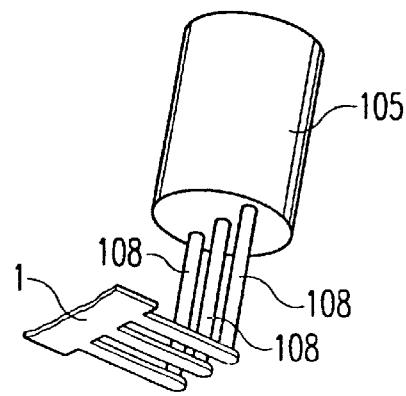

FIG. 4 shows a schematic sectional representation of a "mechatronic" arrangement comprising a gearbox control device, a flexible printed-circuit board and a directly connected electrical component; and FIGS. 5a, and 5b show perspective views of the connection between the flexible printed-circuit board and the electrical component, respectively, from laterally above and laterally below the printed-circuit board.

DETAILED DESCRIPTION OF THE INVENTION

Figure 1A:
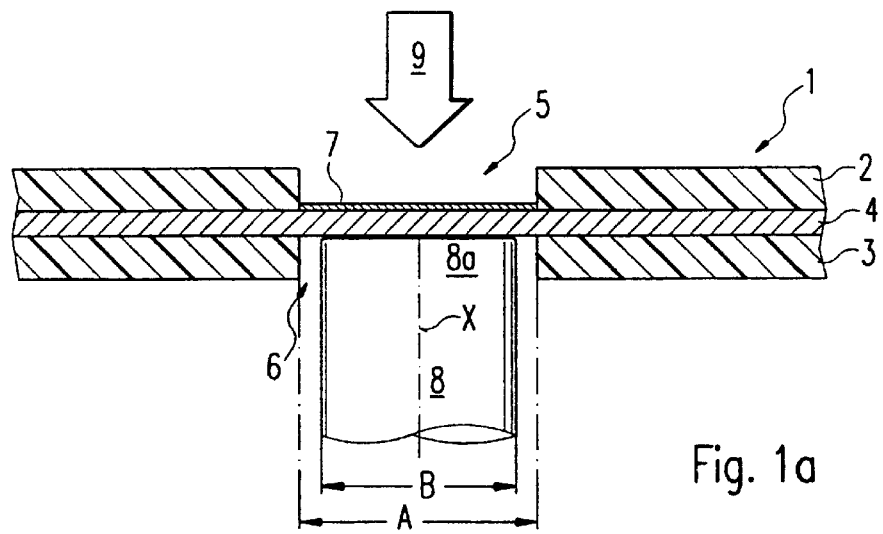
FIG. 1a shows a schematic sectional representation of a flexible printed-circuit board with a metallic mating contact member arranged thereunder before the building up of the welded or soldered joint.

FIG. 1a shows a flexible printed-circuit board 1 which comprises a first insulating layer 2 and a second insulating layer 3, between which a conductor track 4 is embedded. The conductor track 4 may consist, for example, of Cu and have a thickness in the range from approximately 40 µm to 150 µm. The insulating layers 2, 3 may be formed from a polyimide or polyester material and each have a thickness of approximately 25 to 50 µm. While not shown, an acrylic or epoxy resin adhesive may also be present between the conductor track 4 and the insulating layers 2, 3.

In the first insulating layer 2 there is formed an illumination aperture or opening 5. Opposite the illumination aperture 5, the second insulating layer 3 has a connecting opening 6. Both openings 5, 6 may be in the form of circular disks. The openings 5, 6 are preferably made while the insulating layers 2, 3 are separate, before the production of the printed-circuit board 1. After the insulating layers 2, 3 have been joined together, a thin anticorrosive layer 7 may be deposited on the conductor track 4 in the region of the illumination aperture 5 and also may be deposited on the connecting opening 6.

Underneath the conductor track 4 there is a cylindrical, metallic mating contact member 8, to be welded to the conductor track 4. The mating contact member 8 is a contact pin of a plug-in connector and may consist of a Cu alloy, for example CuSn4/5/6, CuSn5Pb1, CuSn4Pb1, CuTeT or CuNi1Pb1T.

Figure 1B:
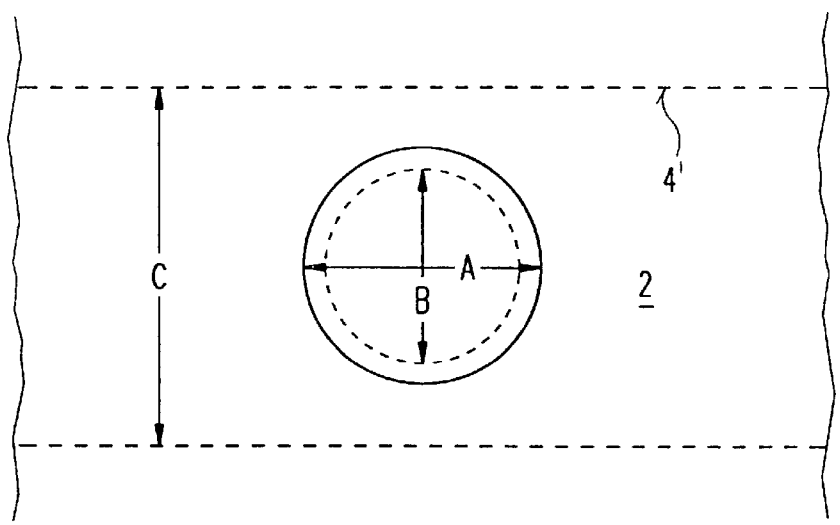
FIG. 1b shows a detail of the flexible printed-circuit board shown in FIG. 1a in plan view.

One method for implementing the present invention for producing a welded joint based on FIGS. 1a and 1b is described below. Initially, the flexible printed-circuit board 1 and the mating contact member 8 are spatially separate from each other. The printed-circuit board 1 and the mating contact member 8 are then aligned in the lateral direction in relation to each other in such a way that the central axis X of the mating contact member 8 runs substantially centrally through the connecting opening 6. Thereafter, the mating contact member 8 and the printed-circuit board 1 are brought together in such a way that an end section 8a of the mating contact member 8 passes through the connecting opening 6 and comes to bear against the conductor track 4. To make this possible, the end section 8a of the mating contact member 8 has a diameter B (for example 2 mm) which is less than the opening diameter A of the connecting opening 6 (for example 3 mm). The step of bringing the printed-circuit board and mating contact member together may be carried out with the printed-circuit board 1 being fixed and the mating contact member 8 moving, or with the mating contact member 8 being fixed and the printed-circuit board 1 moving.

FIG. 1b shows the position of the printed-circuit board 1 and the mating contact member 8 in plan view. The contour line 4' illustrates the width C of the conductor track 4. The width C of the conductor-track 4 may widen in a way not represented in the region of the openings 5, 6 and possibly be less than A or even B in the region outside the openings.

In a next step, laser light 9 is sent by means of a laser through the illumination opening 5 onto the anticorrosive layer 7 or, if such a layer is not present, directly onto the conductor track 4. The anticorrosive layer (for example carbon layer) evaporates at approximately 60° C., i.e. at the beginning of use of the laser even before melting of the conductor track 4 occurs. This ensures that the material of the anticorrosive layer 7 cannot contaminate the welded joint to an extent which would impair the strength of the joint. The laser light 9 consequently melts the conductor track 4 first and subsequently the surface of the section 8a. The laser parameters (pulse energy, repetition rate, etc.) are in this case to be set in such a way that sufficient melted welding material is produced without the complete melting away of the conductor track 4 or damage to the printed-circuit board 1. It has been found that good welding results are achieved with a pulsed Nd:YAG laser. Once a sufficient amount of melted welding material has been produced, the laser is switched off, so that the welded joint is produced by the melt cooling and solidifying.

Figure 2:
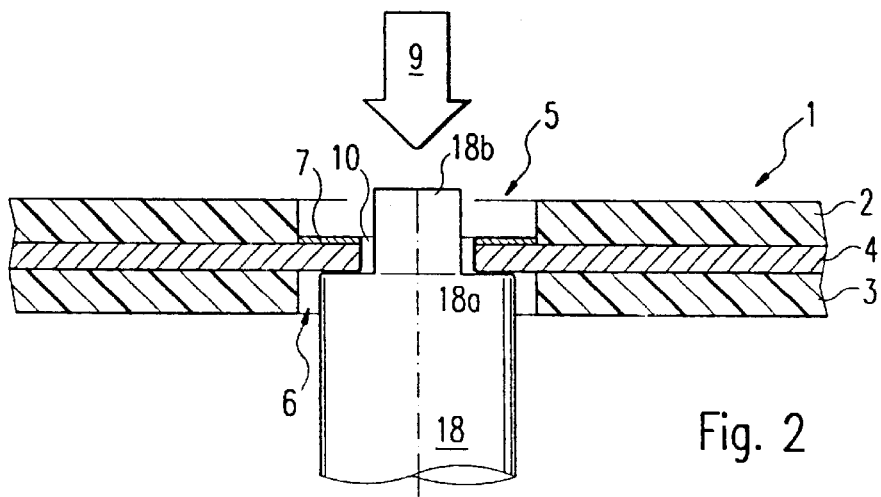
FIG. 2 shows a schematic sectional representation of a preferred embodiment of the invention.

A variation of the present invention is shown in FIG. 2 and differs essentially from the embodiment shown in FIGS. 1a, 1b by a structurally different design of the mating contact member 18 and a through-hole 10, which passes through the conductor track 4 in a central region of the connecting opening 6. The mating contact member 18 is provided on its end section 18a with a projection 18b, which protrudes through the through-hole 10 formed after the step described above of bringing the printed-circuit board and mating contact member together. In a subsequent laser welding step, the projection 18b of the mating contact member 18 is melted first. By adequately dimensioning of the projection 18b, i.e. making the projection large, it can be ensured that sufficient welding material will be available in the welding step.

Figure 3:
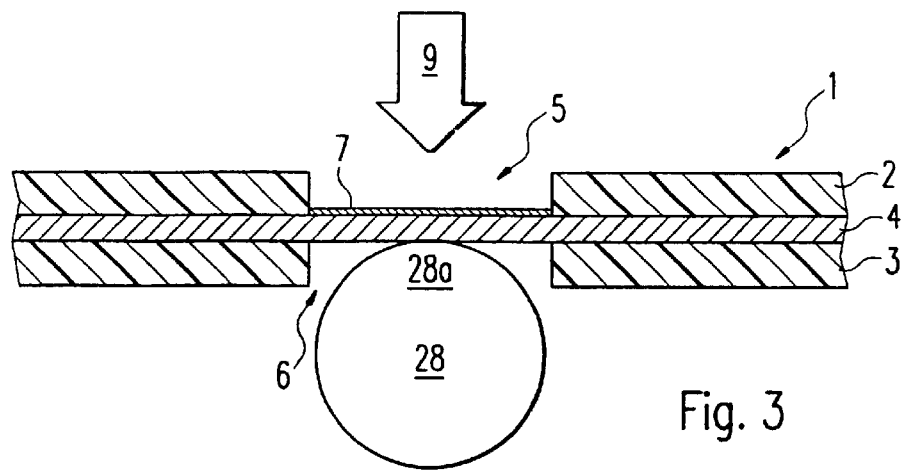
FIG. 3 shows a schematic representation of a further preferred embodiment of the invention in plan view.

FIG. 3 shows a further implementational variation of the present invention in plan view. Here the mating contact member 28 is cylindrical, but unlike FIGS. 1a, 1b and 2 the conductor track 4 is bearing against the peripheral wall of the mating contact member 28. Section 28a of the mating contact member 28 protrudes into the connecting opening 6 and is consequently provided by the wall curvature of the mating contact member 28. In this embodiment, multipoint welding can be obtained along the line of contiguous contact between the conductor track 4 and the mating contact member 28.

In FIG. 4, the present invention is shown to be used with particular advantage in a gearbox or an engine, for electrically bonding electrical components (actuators, sensors) via a flexible printed-circuit board. More specifically, FIG. 4 shows a gearbox control device 100 The gearbox control device 100 comprises a housing cover 101 and a metallic base plate 102. The housing cover 101 and the base plate 102 enclose a cavity 103. In the cavity 103 there is a leadframe 104, on which an electronic circuit is provided. A ceramic substrate which is cemented by an electrically insulating heat-conducting adhesive onto the metallic base plate 102 which serves as a heat sink may be provided as the leadframe 104.

The leadframe 104 is surrounded on all sides by a flexible printed-circuit board 1, which is produced and configured as disclosed hereinabove. The conductor tracks 4 of the flexible printed-circuit board 1 are connected via bonding wires 106, or via direct electrical adhesive contact attachments (not represented) to corresponding contact pads on the leadframe 104.

The housing cover 101 has a peripheral, stepped sealing surface 107, against which an annular seal 109 bears. The flexible printed-circuit board 1 is led out from the cavity 103 of the control device housing 101, 102 between the annular seal 109 and the metallic base plate 102. The housing cover 101 is configured as a support for the control device 100 and, in addition, forms a mounting plate for electronic components arranged outside the cavity 103. In FIG. 4, as an example of an electrical component is represented by a temperature sensor 105, fastened in a mounting opening of the housing cover 101. The flexible printed-circuit board 1 is led on the underside of the housing cover 101 to a temperature sensor 105, where it electrically bonds terminal pins 108 of the temperature sensor 105. The terminal pins 108 provide mating contact members. FIGS. 5a and 5b show in perspective views the connection between the flexible printed-circuit board 1 and the terminal pins 108. The flexible printed-circuit board 1 may be configured with peripherally protruding fingers 1a, 1b, 1c for the electrical bonding of the terminal pins 108.

With the "mechatronic" arrangement shown in FIGS. 4, 5a and 5b, it is possible to dispense with additional parts, such as connectors and the like, both in the region of the control device/printed-circuit board connection and (on account of the direct connection made in accordance with the present invention between the terminal pins 108 and the conductor tracks 4) in the region of the printed-circuit board/electrical component connection, this results in substantial cost savings, particularly in mass production.

We claim:

1. A method for producing an electrical connection between a flexible printed-circuit board constructed from first and second insulating layers and at least one metallic conductor track there between, and a metallic mating contact member, comprising forming an opening in the first insulating layer through which light can pass; forming a connecting opening in the second insulating layer opposite the opening in the first insulating layer; contacting a connecting section of the metallic mating contact member with the metallic conductor track through the connecting opening, said connecting section having a lateral dimension that is smaller than the width of the connecting opening; forming a through-hole between the connecting opening and the opening in the first insulating layer which penetrates the conductor track, the lateral dimension of the through-hole being smaller than the width of the connecting opening; forming a projection on the connecting section of the mating contact member which is inserted in the through-hole; and forming a welded or soldered joint by heating the connecting section projection by a laser light directed through the opening in the first insulating layer.

2. The method according to claim 1, wherein the flexible printed-circuit board has a thickness ranging between about 40 and 150 $\mu$m.

3. The method according to claim 2, wherein the thickness ranges between about 50 and 70 $\mu$m.

4. The method according to claim 1, wherein the metallic mating contact member is a terminal pin of an electrical component and the connecting section is provided by a free end face of the terminal pin.

5. The method according to claim 1, wherein the metallic mating contact member is a terminal pin of an electrical component and the connecting section is provided by a peripheral wall surface of the terminal pin.

6. The method according to claim 1, wherein an organic anticorrosive layer covering the opening in the first insulating layer is applied to the conductor track.

7. An electrical connection site between a flexible printed circuit board and a metallic mating contact member, comprising a flexible printed-circuit board constructed from first and second insulating layers and at least one metallic conductor track therebetween, a light-transmitting opening formed in a first insulating layer, a connecting opening formed opposite the light-transmitting opening in the second insulating layer, a through-hole between the connecting opening and the opening in the first insulating layer which penetrates the conductor track, the lateral dimension of the through-hole being smaller than the width of the connecting opening, wherein the metallic mating contact member comprises a connecting section having a lateral dimension which is smaller than the width of the connecting opening, and wherein the connecting section protrudes through the through-hole for welding or soldering to the metallic conductor track by a laser light directed through the light transmitting opening.

8. The electrical contact site according to claim 7, wherein the mating contact member is a terminal pin or a contact pin.

9. An installation in an engine or gearbox of a motor vehicle, comprising a control device having an oiltight housing in which an electric circuit is located, a flexible printed-circuit board in electrical connection with the electric circuit which is led through a sealing gap in the housing to outside, and electrical components located outside the control device having terminal pins connected directly to the flexible printed-circuit board via an electrical connection site according to claim 7.

10. The installation according to claim 9, wherein the electrical components are sensors and actuators.

* * * * *